(12) United States Patent
Yuan et al.

(10) Patent No.: US 6,987,558 B2
(45) Date of Patent: Jan. 17, 2006

(54) REACTION MASS FOR A STAGE DEVICE

(75) Inventors: Bausan Yuan, San Jose, CA (US);
Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/759,524

(22) Filed: Jan. 16, 2001

(65) Prior Publication Data

US 2002/0093637 A1 Jul. 18, 2002

(51) Int. Cl.
*G03B 27/58* (2006.01)
*G02B 27/42* (2006.01)

(52) U.S. Cl. .......................................... 355/72; 355/53
(58) Field of Classification Search .................. 355/53,
355/72, 75; 310/12; 318/687, 560; 273/110;
356/399, 400, 401
See application file for complete search history.

(56) References Cited

U.S. PATENT DOCUMENTS

| | | | | |
|---|---|---|---|---|
| 4,257,600 A | * | 3/1981 | Goldfarb | ..................... 273/110 |
| 4,750,721 A | | 6/1988 | Sasada | |
| 5,208,497 A | | 5/1993 | Ishii et al. | |
| 5,477,304 A | * | 12/1995 | Nishi | .......................... 355/53 |
| 5,815,246 A | | 9/1998 | Sperling et al. | |
| 5,969,441 A | | 10/1999 | Loopstra et al. | |
| 6,226,075 B1 | | 5/2001 | Loopstra et al. | |
| 6,337,484 B1 | | 1/2002 | Loopstra et al. | |
| 6,414,742 B1 | * | 7/2002 | Korenaga et al. | ............. 355/53 |
| 6,449,030 B1 | | 9/2002 | Kwan | |
| 2002/0054280 A1 | * | 5/2002 | Tokuda et al. | ................ 355/53 |

FOREIGN PATENT DOCUMENTS

EP        0 973 067 A2      1/2000

* cited by examiner

*Primary Examiner*—Peter B. Kim
(74) *Attorney, Agent, or Firm*—Finnegan, Henderson, Farabow, Garrett & Dunner, L.L.P.

(57) ABSTRACT

A stage assembly and support system are provided to stabilize a stage base, such as a wafer stage base or a reticle stage base, minimizing forces transmitted from the stage assembly to a stationary surface, such as the ground, and thereby preventing vibration of other parts or systems in a wafer manufacturing process. Depending of the applicable photolithography system, a reticle stage and/or a wafer stage are accelerated in response to a wafer manufacturing control system to position the semiconductor substrates. The jerking motions of the reticle stage and/or wafer stage cause reaction forces acting on the reticle stage base and/or wafer stage base. The reaction forces induce vibration to the stationary surface and surrounding parts of the photolithography system. The wafer stage assembly and support system according to this invention allow the reticle stage base and/or wafer stage base to move relative the stationary surface. The base, acting as a massive reaction mass, stores a kinetic energy from the reaction force and gradually dissipates such energy by applying small forces to the reaction mass. The stage assembly and support system according to this invention are also capable of canceling any disturbance forces acting on the base.

51 Claims, 11 Drawing Sheets

REACTION MASS FOR A STAGE DEVICE

BACKGROUND OF THE INVENTION

1. Field of the Invention

This invention relates to a stage assembly, a support system, and method for stabilizing the stage assembly in a photolithography process to manufacture semiconductor wafers. More particularly, this invention relates to the stage assembly, support system, and method for stabilizing the stage assembly to prevent ground vibration.

2. Description of the Related Art

In manufacturing integrated circuits using photolithography, light is transmitted through non-opaque portions of a pattern on a reticle, or photomask, through a projection exposure apparatus, and onto a wafer of specially-coated silicon or other semiconductor material. The uncovered portions of the coating, that are exposed to light, are cured. The uncured coating is then removed by an acid bath. Then, the layer of uncovered silicon is altered to produce one layer of the multi-layered integrated circuit. Conventional systems use visible and ultraviolet light for this process. Recently, however, visible and ultraviolet light have been replaced with electron, x-ray, and laser beams, which permit smaller and more intricate patterns.

As the miniaturization of a circuit pattern progresses, the focus depth of the projection exposure apparatus becomes very small, making it difficult to align accurately the overlay of circuit patterns of the multi-layered integrated circuit. As a result, a primary consideration for an overall design of the photolithography system includes building components of the system that achieve precision by maintaining small tolerances. Any vibration, distortion, or misalignment caused by internal, external or environmental disturbances must be kept at minimum. When these disturbances affect an individual part, the focusing properties of the photolithography system are collectively altered.

In a conventional exposure apparatus of a photolithography system, a wafer stage assembly is used in combination with a projection lens assembly to manufacture semiconductor wafers. The wafer stage assembly includes a wafer table to support the wafer substrates, a wafer stage to position the wafer substrates as the wafer stage is being accelerated by a force generated in response to a wafer manufacturing control system, and a wafer stage base to support the wafer stage. The wafer manufacturing control system is the central computerized control system executing the wafer manufacturing process. To permit smaller and more intricate circuit pattern, the projection lens assembly must accurately focus the energy beam to align the overlay of circuit patterns of the multi-layered integrated circuit.

The conventional exposure apparatus generally includes an apparatus frame which rigidly supports the wafer stage assembly, the projection lens assembly, the reticle stage assembly, and an illumination system. In operation, the exposure apparatus transfers a pattern of an integrated circuit from a reticle onto the wafer substrates. The exposure apparatus can be mounted to a base, such as the ground or via a vibration isolation system.

There are several different types of photolithography devices, including a scanning type and a step-and-repeat type. In the scanning type photolithography system, the illumination system exposes the pattern from the reticle onto the wafer with the reticle and the wafer moving synchronously. The reticle stage moves the reticle on a plane which is generally perpendicular to an optical axis of the lens assembly, while the wafer stage moves the wafer on another plane generally perpendicular to the optical axis of the lens assembly. Scanning of the reticle and wafer occurs while the reticle and wafer are moving synchronously.

Alternately, in the step-and-repeat type photolithography system, the illumination system exposes the reticle while the reticle and the wafer are stationary. The wafer is in a constant position relative to the reticle and the lens assembly during the exposure of an individual field. Subsequently, between consecutive exposure steps, the wafer is consecutively moved by the wafer stage perpendicular to the optical axis of the lens assembly so that the next field of the wafer is brought into position relative to the lens assembly and the reticle for exposure. Following this process, the images on the reticle are sequentially exposed onto the fields of the wafer.

Regardless of the type of photolithography system being used, to focus accurately the image transferred from the reticle onto the wafer, the exposure apparatus must align a position of an exposure point on the wafer with a position of the focal point of the projection lens assembly.

To maximize throughput of wafer production, the reticle stage and the wafer stage must move at high acceleration rates. To generate high acceleration rates, the force generating motors must produce large stage forces $F_{in}$ over short durations to move the reticle stage or the wafer stage, such as diagrammatically shown in FIG. 2A. The stage forces move either the reticle stage or wafer stage according to the graph shown in FIG. 3A.

According to Newton's second law, these types of impulses generate reaction forces on the base, which cause the reticle stage base or a wafer stage base to move according to the graph shown in FIG. 3B. Since both the reticle base and wafer stage base are rigidly connected to the apparatus frame of the exposure apparatus, the reaction forces are transmitted to the apparatus frame and the ground, causing a detrimental vibration to the photolithography system.

Therefore, there is a need for an improved stage assembly, stage support system, and method to eliminate or substantially reduce the vibration.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, one aspect of the invention is a support system for stabilizing and supporting a base on a stationary surface. The base supports a device which is moved by a predetermined force. The support system comprises a set of bearings and a set of actuators. The set of bearings supports the base allowing the base to move relative to the stationary surface. The base moves due to at least one of a reaction force and a disturbance force acting on the base. The reaction force is responsive to the predetermined force acting on the device supported by the base. The set of actuators controls movement of the base in at least one degree of freedom.

Another aspect of the present invention is a stage assembly for manufacturing semiconductor wafers, comprising a stage and a base supporting the stage. The stage positions at least one substrate, and is being moved by a first member of a force generator in response to a wafer manufacturing control system. The base is being allowed to move in response to a reaction force generated by a second member of the force generator. The stage assembly also comprises a set of bearings to support the base allowing the base to move relative to a stationary surface, and a set of actuators to control movement of the base, the movement being caused by a disturbance force.

A further aspect of the present invention is a stage assembly for manufacturing semiconductor wafers, comprising a stage and a base supporting the stage. The stage positions at least one substrate, and is being moved in accordance with a wafer manufacturing control system. The base is being allowed to move in response to a reaction force generated by a movement of the stage. The stage assembly also comprises a set of bearings to allow the base to levitate above a stationary surface, and a set of actuators to control movement of the base. The movement may be caused by any disturbance force.

Yet a further aspect of the present invention is a method for reducing a vibration force transmitted by a base to a stationary surface. The method comprises the steps of supporting the base and levitating the base above the stationary surface so that the base can move relative to the stationary surface, and controlling movement of the base in at least one degree of freedom, the movement being caused by a disturbance force.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to an embodiment of the apparatus, system, and method consistent with the principles of the present invention, examples of which are illustrated in the accompanying drawings. The invention will be further clarified by the following examples, which are intended to be exemplary of the invention.

The apparatus, system, and method consistent with the principles of the present invention are useful to minimize forces transmitted from a moving object, such as a wafer stage assembly of a photolithography system, to a stationary surface, such as the ground or an exposure apparatus frame. Therefore, vibrations from the wafer stage assembly to other parts of the photolithography system can be prevented. The principles of this invention are similarly applicable to other parts of the photolithography system, such as a reticle stage assembly. Thus, this invention is not limited to any particular application. Rather, the stage assembly, support system, and method disclosed herein could be used in any system configured to embody similar elements disclosed which require stabilization as the system is being accelerated.

Figure 1:
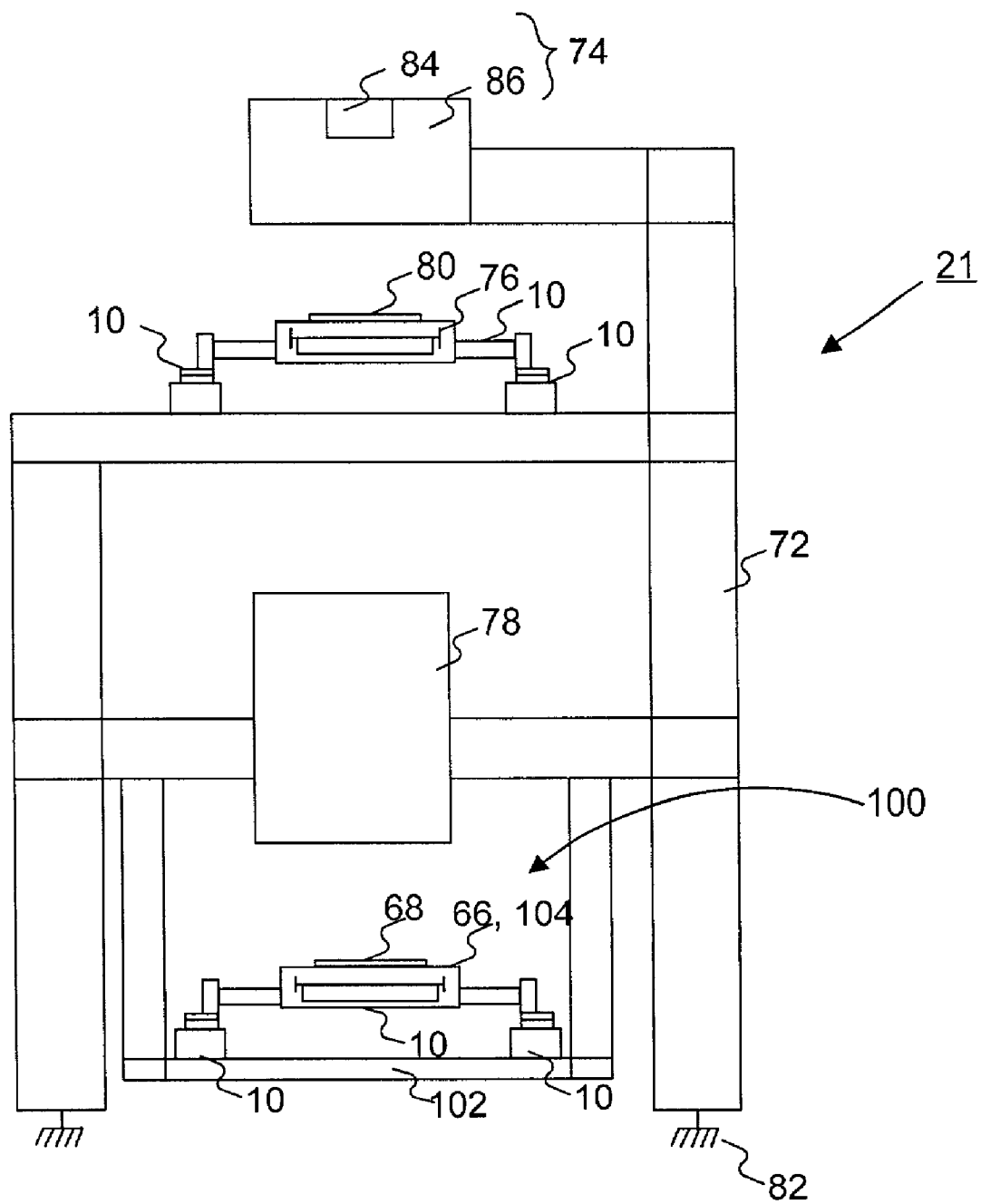
FIG. 1 is a schematic elevation view of an exposure apparatus having a conventional wafer stage assembly.

FIG. 1 illustrates an exposure apparatus 21 of a photolithography system having a wafer stage assembly 100 used in combination with a projection lens assembly 78 to manufacture semiconductor wafers 68. A wafer table 104 supports wafer 68, while a wafer stage 66 positions a semiconductor wafer 68 as wafer stage 66 is accelerated by a stage force (not shown) generated in response to a wafer manufacturing control system (not shown). The wafer manufacturing control system is the central computerized control system executing the wafer manufacturing process. To permit smaller and more intricate circuit patterns, projection lens assembly 78 must accurately focus the energy beam to align the overlay of circuit patterns of the multi-layered integrated circuit.

In operation, exposure apparatus 21 transfers a pattern of an integrated circuit from a reticle 80 onto semiconductor wafer 68. Exposure apparatus 21 can be mounted to a the ground 82, or a vibration isolation system (not shown). An apparatus frame 72 is rigid and supports the components of exposure apparatus 21, including a reticle stage 76, wafer stage 66, lens assembly 78, and an illumination system 74.

Illumination system 74 includes an illumination source 84 to emit a beam of light energy. Illumination system 74 also includes an illumination optical assembly 86 to guide the beam of light energy from illumination source 84 to lens assembly 78. The beam selectively illuminates different portions of reticle 80 and exposes wafer 68.

Lens assembly 78 projects and/or focuses the light passing through reticle 80 to wafer 68. Lens assembly 78 may magnify or reduce the image illuminated on reticle 80. Lens assembly 78 may also be a 1× magnification system.

Reticle stage 76 holds and positions reticle 80 relative to lens assembly 78 and wafer 68. Similarly, wafer stage 66 holds and positions wafer 68 with respect to the projected image of the illuminated portions of reticle 80. Wafer stage 66 and reticle stage 76 are moved by a plurality of motors 10.

Figure 4:
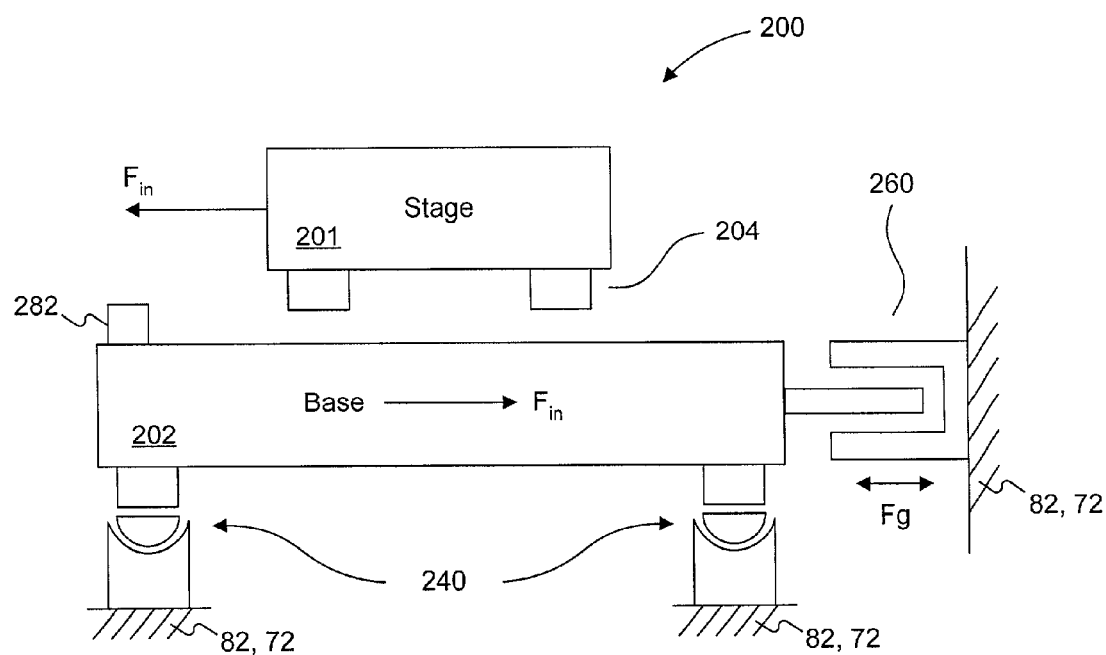
FIG. 4 is a schematic view of a stage assembly consistent with the principles of the present invention.

Consistent with the principles of the present invention and as illustrated in FIG. 4, a stage assembly 200 is schematically illustrated for manufacturing semiconductor wafers. A base 202 supports stage 201 via a first set of bearings 204. Stage 201 may represent reticle stage 76 or wafer stage 66 shown in FIG. 1. Stage 201 levitates above base 202 on first bearings 204. First bearings 204 could be any types of bearings which allow stage 201 to move linearly along the x and y axes as well as rotationally around the z axis. Thus, first bearings 204 have three degrees of freedom. For example, first bearings 204 could be a pneumatic system, such as air bearings, or magnetic levitation, mechanical support, or any equivalent support system.

Stage 201 is accelerated by a stage force $F_{in}$ produced by a force generator (not shown), such as a motor 10 shown in FIG. 1. Stage force $F_{in}$ is generated as a result of the wafer manufacturing control system. Motor 10 could be a planar motor, a linear motor, or any types of commercially available force generator to move stage 201.

In either a planar or linear motor or other types of motors, the force generator commonly has a moving member (not shown), such as a set of magnets, and a stationary member (also not shown), such as a set of coils. In one embodiment, the moving member is attached to an underside of stage 201, and the stationary member attached to an upperside of base 202. Conversely, the moving member may be attached to the upperside of base 202, and the stationary member attached to the underside of stage 201.

Consistent with the principles of the present invention, the second set of bearings 240 is provided to allow base 202 to move relative the stationary surface or ground 82. Base 202 levitates above stationary surface, such as ground 82, on second bearings 240. Second bearings 240 could be any types of bearings which allow base 202 to move in any directions necessary to reduce reaction forces on the ground 82. In one embodiment, base 202 may move linearly along the x and y axes as well as rotationally around the z axis. Thus, second bearings 240 may have three degrees of freedom. In other embodiments, base 202 may move in more or less than three degrees of freedom.

Second bearings 240 could be a pneumatic system, such as air bearings, or magnetic levitation, mechanical support, or an equivalent support system. In one embodiment shown in FIG. 6, second bearings 240 are a set of three air bearings. Only air bearings 240a and 240b are shown. In the illustrated embodiment, air bearings 240a and 240b are disposed on an undersurface 202b of base 202 adjacent to a front face 202c parallel to the x axis. The third air bearing (not shown) could be positioned on underside 202b near the mid-section of a rear face 202d.

Figure 7:
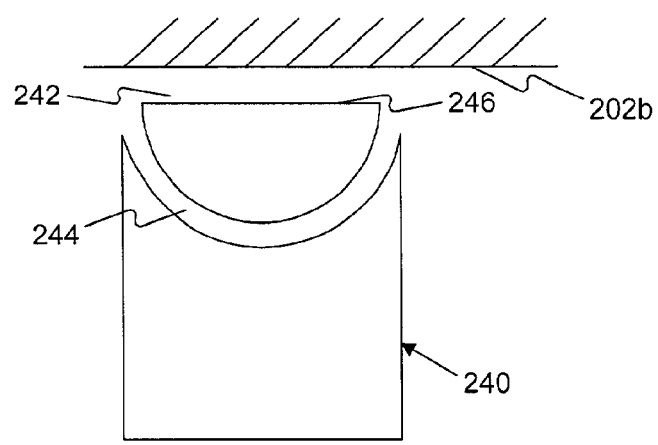
FIGS. 7 and 8 are schematic elevation views of an air bearing supporting the base consistent with the principles of the present invention.
Figure 8:
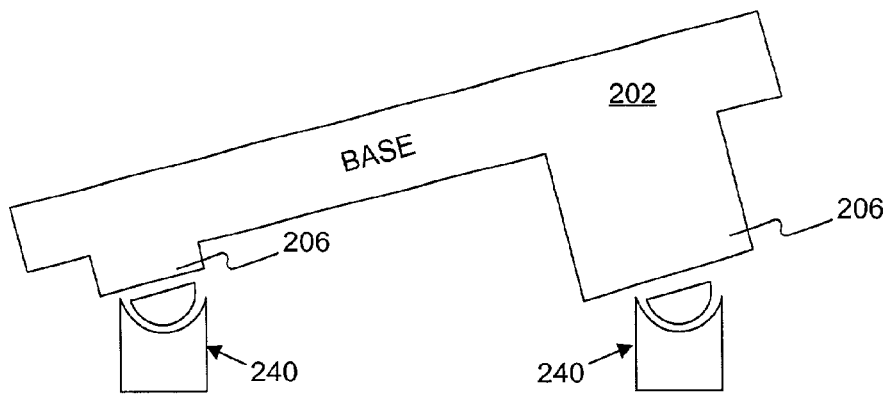

Undersurface 202b of base 202 may have a plurality of base paddings 206 (shown in FIG. 8) positioned to interface with second bearings 240. As shown in FIG. 7, each air bearing 240 produces a first planar layer of pressurized air 242 to allow base 202 to move linearly along the x and y axes, and to rotate around the z axis. Each air bearing 240 also produces a second spherical layer of pressurized air 244 to allow a top flat surface 246 of bearing 240 to pivotally conform to the contour of undersurface 202b of base 202. The pivoting action of second bearings 240 compensate for circumstances when the surfaces of base paddings 206 are not perfectly aligned as illustrated in exaggeration for exemplary purposes on FIG. 8. Other types of pivoting supports, for example, flexure mounts, can also be used.

Figure 3A:
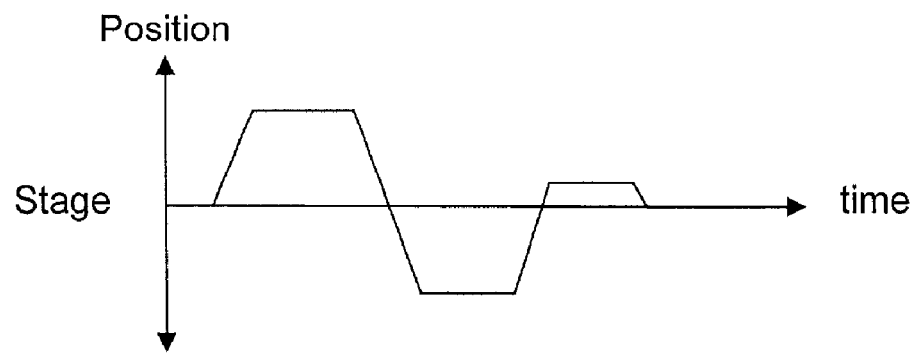
FIG. 3A is a graph illustrating a trajectory profile of a stage.
Figure 3B:
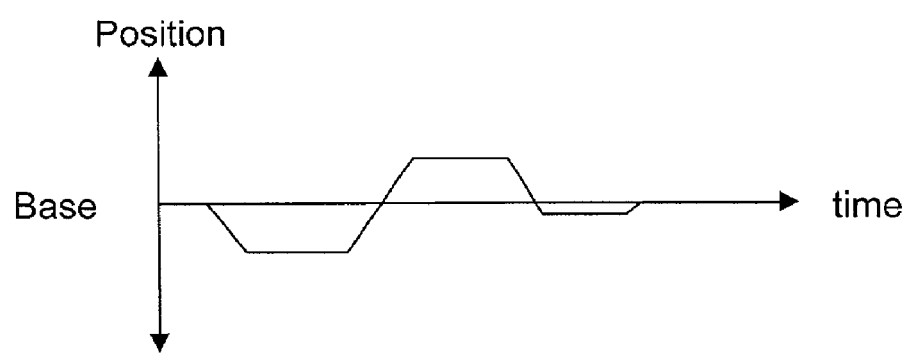
FIG. 3B is a graph illustrating a trajectory profile of a base in response to the position profile of the stage shown in FIG. 3A.
Figure 5A:
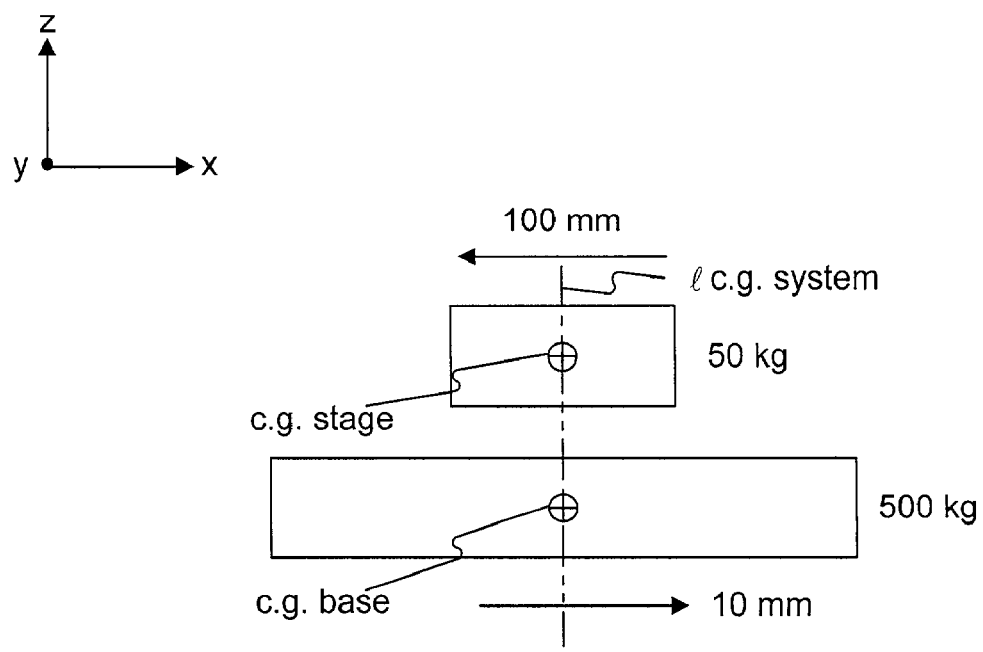
FIGS. 5A and 5B are diagrams illustrating the concept of conservation of momentum applied to the stage assembly consistent with the principles of the present invention.

In accordance with Newton's third law, stage force $F_{in}$ acts in an equal magnitude but in opposite directions on stage 201 and base 202. Whatever motion stage 201 makes, base 202 will make the exact opposite motion scaled by the ratio of masses between stage 201 and base 202. In the photolithography system, generally base 202 weighs more than stage 201. Generally, stage 201 and base 202 move synchronously in opposite directions with the motion of stage 201 having a bigger amplitude. Thus, a trajectory or motion profile of stage 201 and base 202 can be determined and follows a pattern such as shown in FIGS. 3A and 3B, respectively. For example, as illustrated in FIG. 5A, if stage 201 weighs 50 kg and base 202 weighs 500 kg, when stage 201 moves 100 mm to the left along the x axis, base 202 will move 10 mm to the right along the x axis, and accordingly base 202 will be accelerated at a rate of $\frac{1}{10}^{th}$ of the acceleration rate of stage 201.

Consistent with the principles of the present invention and as illustrated in FIG. 4, base 202 is allowed to move thereby reducing or substantially eliminating the amplitude of reaction forces $F_{in}$ acting on base 202. Due to its large size in comparison with stage 201, base 202 acts as a massive reaction mass to store the energy of reaction force $F_{in}$ acting on base 202 as kinetic energy. The impulse (I) of stage force $F_{in}$ acting on both stage 201 and base 202 is a mathematical integration of $F_{in}$ with respect to time and equals to the change in momentum of stage 201 and base 202, according to the following formula:

$$I_{stage} = m_{stage} \cdot \Delta v_{stage} = \int F_{in} dt = -m_{base} \cdot \Delta v_{base}$$

Figure 2A:
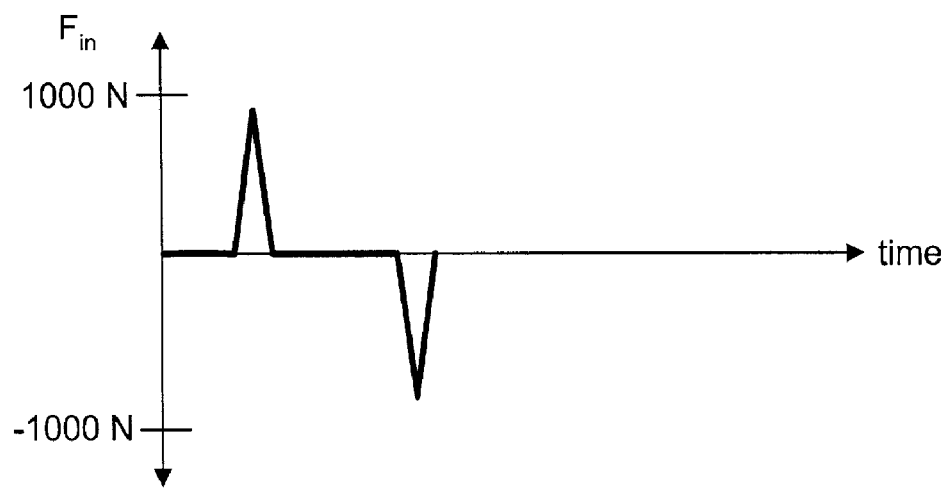
FIG. 2A is a graph illustrating the profile of a force accelerating a conventional stage.

As shown in FIG. 2A, the area bounded by the force profile with the x axis also represents the value of impulse $I_{stage}$.

Figure 5B:
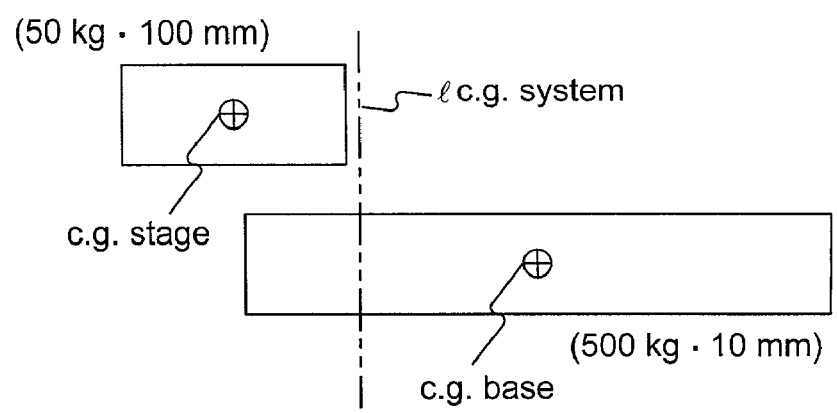

According to a first principle of the present invention involving the theory of conservation of momentum, the combined center of gravity of stage 201 and base 202 remains substantially stationary as illustrated in FIGS. 5A and 5B. For example, as shown in FIG. 5A, when stage 201 weighing 50 kg travels 100 mm (0.1 m) to the left along the x axis, then base 202 weighing 500 kg travels 10 mm (0.01 m) to the right along the x axis. However, as shown in FIG. 5B, the combined center of gravity of the system comprising stage 201 and base 202 remains stationary along vertical axis $l_{cg}$. Therefore, the stage assembly and support system consistent with the principles of the present invention produce minimal, if any, vibration or disturbances.

A set of ground actuators 260 (only one is schematically shown in FIG. 4) acts between base 202 and a stationary surface, such as ground 82 or apparatus frame 72, to counteract any disturbances acting on the base 202. Theoretically, the stage 201 and base 202 move with perfect conservation of momentum, and no force is required from the ground actuators 260. In practice, however, there are always disturbances to the base 202 which must be corrected by the ground actuators 260.

According to a second principle of the present invention, actuators 260 may act like a passive spring and/or damper. In one embodiment according to the second principal, a plurality of passive springs and/or dampers (not shown) indeed may be used as actuators 260. Particularly, according to the second principal, the combined center of gravity of stage 201 and base 202 does move, and thus, actuators 260 do apply ground force $F_g$ on the ground 82 or apparatus frame 72. However, the stage assembly 200, due to its movable base 202, reduces the magnitude of the motion of the combined center of gravity and the magnitude of ground force $F_g$, which thereby makes the stage assembly 200 consistent with the second principal of the present invention operate smoother.

Also, according to the second principle of the present invention, the set of ground actuators 260 acts between base 202 and a stationary surface, such as ground 82 or apparatus frame 72, to dissipate the kinetic energy by applying small forces to the reaction mass or base 202. To remove the momentum of base 202 as calculated using the above equation from base 202, actuators 260 must produce an equal impulse according to the following formulae:

$$I_{base} = I_{stage\ assembly}$$
$$= m_{base} \cdot \Delta v_{base} = \int F_g dt$$

Figure 2B:
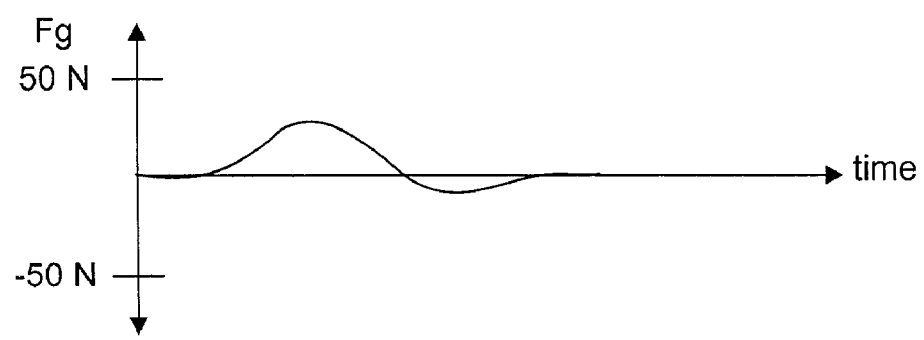
FIG. 2B is a graph illustrating the profile of a force acting on the ground produced by a stage consistent with the principles of the present invention.

Because of the massive weight of base 202, its velocity is relatively low, and its momentum can be cancelled by a small force $F_g$ (also referred to as a trim force) acting over a longer duration, as shown in FIG. 2B. Thus, trim force $F_g$ has a smoother profile and smaller amplitude, thereby inducing less, if any, vibration to ground 82 or apparatus frame 72 than if base 202 were rigidly attached to ground 82 or apparatus frame 72.

Further consistent with both principles of the present invention, the ground actuators 260 (shown in FIG. 4) can cancel out any force(s) created by disturbances to base 202. Alternatively, ground actuators 260 may be connected to apparatus frame 72 or connected to both ground 82 and apparatus frame 72. One advantage of connecting base 202 to ground 82 is that the disturbance forces are dissipated to and absorbed by ground 82, thus reducing disturbances to exposure apparatus 21 and the lithography system.

Figure 6:
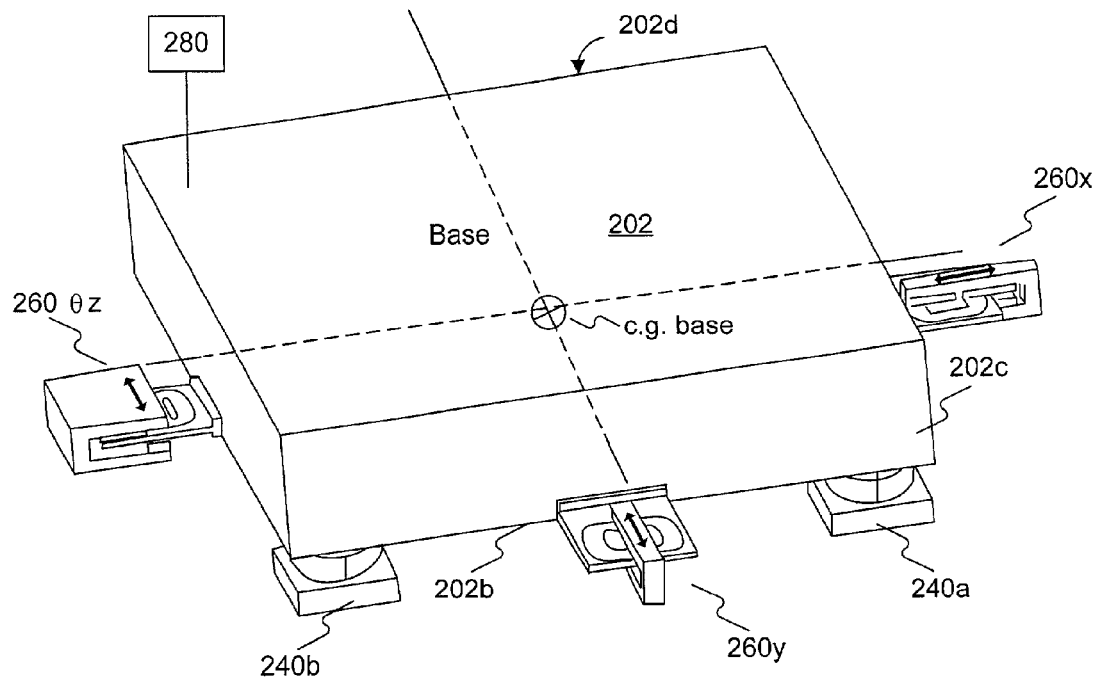
FIG. 6 is a perspective view of an embodiment of the base consistent with the principles of the present invention.

FIG. 6 shows one embodiment whereby a set of three ground actuators 260x, 260y, and 260$_{\Theta z}$ is provided. Ground actuator 260x controls the linear motion of base 202 along the x axis, while ground actuator 260y controls the motion along the y axis. Ground actuator 260$_{\Theta z}$ controls the rotational motion of base 202 around the z axis. In one embodiment, ground actuator 260x is positioned so that it generates a correction force $F_{gx}$ acting through the center of gravity of base 202 along the x axis. Similarly, ground actuator 260y is positioned so that it generates a correction force $F_{gy}$ acting through the center of gravity of base 202 along the y axis. Therefore, by generating correction forces $F_{gx}$ and $F_{gy}$ passing through the center of gravity of base 202, ground actuators 260x and 260y do not generate any torque that will imbalance base 202. In the embodiment discussed above, ground actuator 260$_{\Theta z}$ is positioned not passing through the center of gravity of base 202 so that it produces a correction torque $T_{\Theta z}$ about the z axis to counter any rotational imbalance acting on base 202.

Ground actuators 260x, 260y, and 260$_{\Theta z}$ can be any types of actuators, such as voice-coil motors (VCM) that utilizes a magnetic field for generating a driving force (Lorentz force) as shown in FIG. 6, or they can also be planar motors, linear motors, rotary motors with linkages, a combination thereof, or any equivalent mechanism. Alternatively, ground actuators 260x, 260y, and 260$_{\Theta z}$ can be any types of passive components, such as springs, dampers, a combination thereof, or any equivalent mechanism.

Further consistent with the principles of the present invention, one or more sensors 282, as schematically shown in FIG. 4, is/are provided to detect any disturbance forces acting on base 202. Sensors 282 keep track of the motion, lateral or rotational, of base 202 in all directions to assure that base 202 follows the predetermined trajectory motion as illustrated in FIG. 3B. Sensors 282 may be one or more position sensors, velocity sensors, or acceleration sensors. In the block diagram of FIG. 9, sensors 282 are position sensors.

Figure 9:
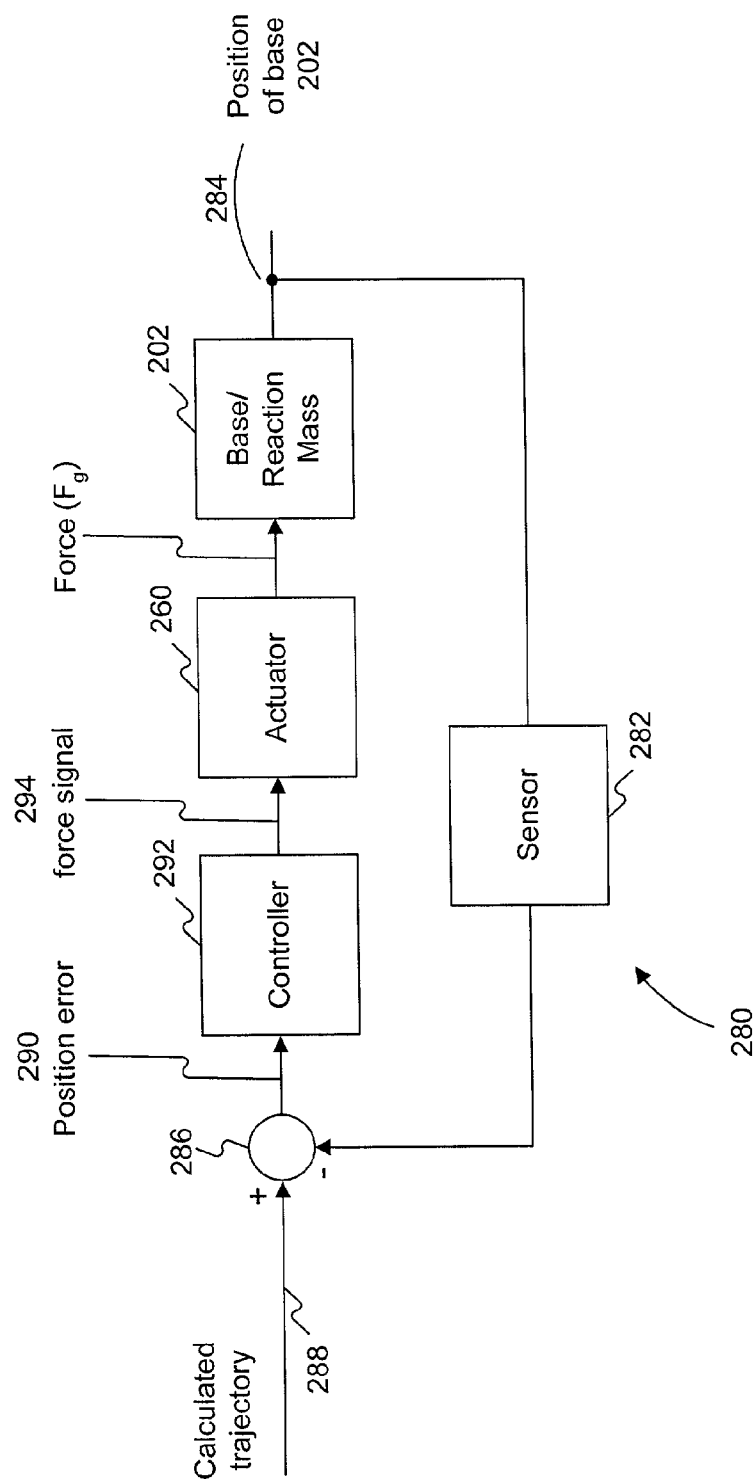
FIG. 9 is a block diagram of a control system to monitor the base consistent with the principles of the present invention.

As illustrated in FIG. 9, a base control system 280 is provided to determine the amount of correction forces $F_{gx}$, $F_{gy}$, and correction torque $T_{\Theta z}$ to be generated by ground actuators 260x, 260y, and 260$_{\Theta z}$, respectively, corresponding to the measurements detected by sensor 282. Alternatively, a plurality of base control systems may be provided, each is similar to base control system 280, corresponding to the measurement detected by each of a plurality of sensors 282.

In either alternatives of control system 280, reference number 284 represents the actual position of base 202 which may be affected by any disturbance forces as measured by sensor 282. A summing junction 286 compares the measured position of base 202 with a calculated trajectory 288 or desired position of base 202 as determined from the trajectory shown in FIG. 3B. Summing junction 286 calculates a position error signal 290 based on the difference between actual position 284 and calculated position 288. Based on position error signal 290, a controller 292 generates a correction force signal 294 for at least one of actuators 260, which then generates the corresponding correction force $F_g$ to be applied to the reaction mass or base 202.

Figure 10:
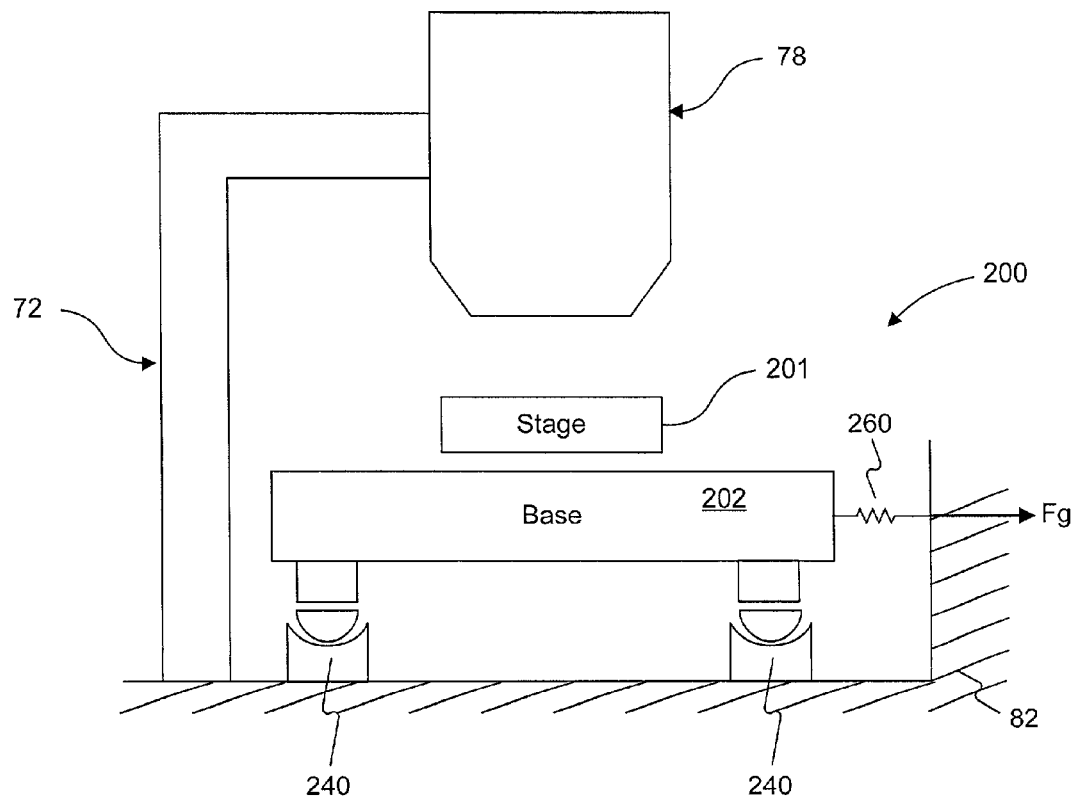
FIG. 10 is a schematic of the exposure apparatus having the wafer stage assembly consistent with the principles of the present invention.

FIG. 10 shows stage assembly 200 consistent with the principles of the present invention and incorporated with an exposure apparatus 21 shown in FIG. 1 of a photolithography system to manufacture semiconductor wafers. Second bearings 240 allow base 202 to move relative to the stationary surface, such as ground 82 or apparatus frame 72. In addition, actuators 260 counteract any disturbance forces or vibration acting on base 202 which cause position error of stage assembly 200 relative to projection lens assembly 78. Therefore, stage assembly 200 substantially reduces the vibration from stage 201 to transmit to apparatus frame 72, other parts of exposure apparatus 21, and subsequently to ground 82.

However, the use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride (LaB$_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No, 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor or electromagnets, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage 201 and the other unit is mounted on the base 202.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 11:
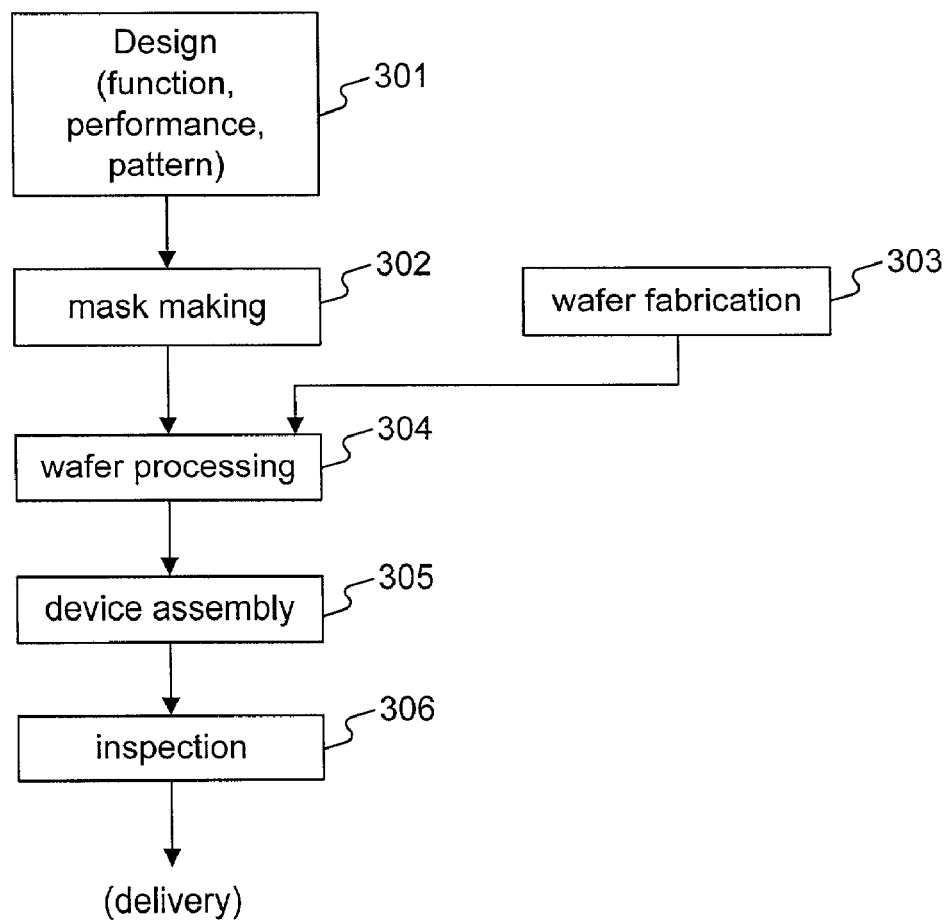
FIG. 11 is a flow chart outlining a process for manufacturing a semiconductor wafer consistent with the principles of the present invention.

Further, semiconductor devices can be fabricated using the above described systems, by the process shown generally in FIG. 11. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 12:
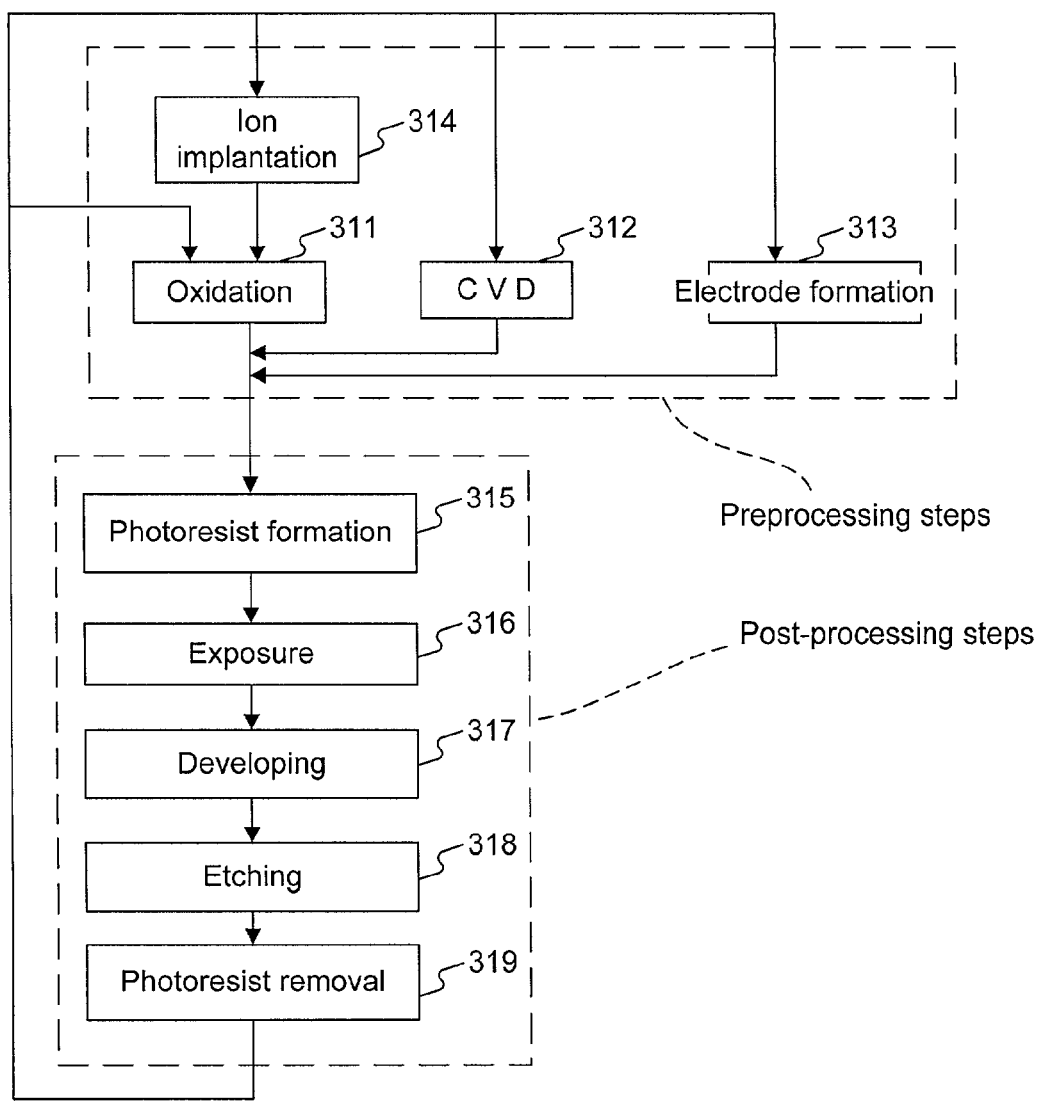
FIG. 12 is a flow chart outlining the semiconductor manufacturing process in further detail.

FIG. 12 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the staggered diffraction pattern, the multi-lens array to form the staggered diffraction pattern, and the methods described, the material chosen for the present invention, and in construction of the multi-lens array, the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A stage assembly for manufacturing semiconductor wafers, comprising:

a stage to position at least one substrate, the stage being moved by a force generator in response to a wafer manufacturing control system;

a base having an upper side supporting the stage, the base being allowed to move in response to a reaction force generated by the force generator;

at least one bearing having a plurality of pressurized air layers to support the base allowing the base to move relative to a stationary surface; and at least one actuator to control movement of the base, the movement being caused by at least one of a disturbance force and the reaction force, the at least one actuator comprising an actuator disposed adjacent to a side outer surface of the base to generate a correction torque about an axis perpendicular to the upper side of the base.

2. The stage assembly of claim 1, wherein the stage and the base move in opposite directions and travel inversely proportionate distances corresponding to a stage mass and a base mass.

3. The stage assembly of claim 2, wherein a combined center of gravity of the stage and the base remains stationary.

4. The stage assembly of claim 1, wherein the at least one bearing comprises one of a plurality of pneumatic bearings, magnetic bearings, and mechanical bearings, and a combination thereof.

5. The stage assembly of claim 4, wherein the plurality of pneumatic bearings comprise:

a first layer of pressurized air to allow the base to move linearly along a first axis and a second axis, and to rotate around a third axis, the first, second, and third axes being orthogonal to each other.

6. The stage assembly of claim 5, wherein the plurality of pneumatic bearings further comprise:

a second layer of pressurized air to allow a top flat surface of each of the plurality of pneumatic bearings to conform to an undersurface of the base.

7. The stage assembly of claim 1, wherein the at least one actuator comprises one of a plurality of voice-coil motors, planar motors, linear motors, rotary motors with linkages, springs, dampers, and a combination thereof.

8. The stage assembly of claim 1, further comprising:

a sensor to detect at least one of an actual position, an actual velocity, and an actual acceleration of the base.

9. The stage assembly of claim 8, further comprising:

a control system to determine an error signal for the at least one actuator to generate a correction force to cancel the at least one of the disturbance force and the reaction force.

10. The stage assembly of claim 9, wherein the error signal is calculated based on a discrepancy between at least one of the actual position, the actual velocity and the actual acceleration, and a corresponding predetermined position, predetermined velocity, and predetermined acceleration of the base.

11. The stage assembly of claim 1, wherein the base has at least one degree of freedom, and the at least one actuator is capable of constraining the movement of the base in at least one degree of freedom.

12. The stage assembly of claim 11, wherein the at least one actuator comprises:

a first actuator disposed adjacent to the base to generate a first correction force.

13. The stage assembly of claim 12, wherein the at least one actuator further comprises:

a second actuator disposed adjacent to the base to generate a second correction force.

14. The stage assembly of claim 13, wherein the first actuator generates the first correction force acting in a first direction, and the second actuator generates the second correction force acting in a second direction.

15. The stage assembly of claim 13, wherein the first actuator generates the first correction force acting in a first direction passing through a center of gravity of the base, and the second actuator generates the second correction force acting in a second direction passing through the center of gravity of the base, and the actuator disposed adjacent to the side outer surface of the base generates the correction torque around a third direction.

16. A projection lens assembly comprising the stage assembly of claim 1.

17. An object on which an image has been formed by the projection lens assembly of claim 16.

18. A lithography system comprising the projection lens assembly of claim 16.

19. A stage assembly for manufacturing semiconductor wafers, comprising:

a stage to position at least one substrate, the stage being moved in accordance with a wafer manufacturing control system;

a base having an upper side supporting the stage, the base being allowed to move in response to a reaction force generated by a movement of the stage:

at least one bearing having a plurality of pressurized air layers to allow the base to levitate above a stationary surface; and at least one actuator to control movement of the base, the movement being caused by at least one of a disturbance force and the reaction force, the at least one actuator comprising an actuator disposed adjacent to a side outer surface of the base to generate a correction torque about an axis perpendicular to the upper side of the base.

20. The stage assembly of claim 19, wherein the stage and the base move in opposite directions traveling inversely proportionate distances corresponding to a stage mass and a base mass.

21. The stage assembly of claim 20, wherein a combined center of gravity of the stage and the base remains stationary.

22. The stage assembly of claim 19, wherein the at least one bearing comprises:

one of a plurality of pneumatic bearings, magnetic bearings, and mechanical bearings, and a combination thereof.

23. The stage assembly of claim 22, wherein the plurality of pneumatic bearings comprise:

a first layer of pressurized air to allow the base to move linearly along a first axis and a second axis, and to rotate around a third axis, the first, second, and third axes being orthogonal to each other.

24. The stage assembly of claim 23, wherein the plurality of pneumatic bearings further comprise:

a second layer of pressurized air to allow a top flat surface of each of the plurality of pneumatic bearings to conform to an undersurface of the base.

25. The stage assembly of claim 19, wherein the at least one actuator comprises:

one of a plurality of voice-coil motors, planar motors, linear motors, rotary motors with linkages, springs, dampers, and a combination thereof.

26. The stage assembly of claim 19, further comprising:

at least one sensor to detect at least one of an actual position, an actual velocity, and an actual acceleration of the base.

27. The stage assembly of claim 26, further comprising:

a control system to determine an error signal for the at least one actuator to generate at least one of a correction force and a correction torque to control the position of the base.

28. The stage assembly of claim 27, wherein the error signal is calculated based on a discrepancy between at least one of the actual position, the actual velocity and the actual acceleration, and a corresponding predetermined position, predetermined velocity, and predetermined acceleration of the base.

29. The stage assembly of claim 19, wherein the base has at least one degree of freedom, and the at least one actuator is capable of constraining the movement of the base in at least one degree of freedom.

30. The stage assembly of claim 29, wherein the at least one actuator comprises:
a first actuator disposed adjacent to the base to generate a first correction force.

31. The stage assembly of claim 30, wherein the at least one actuator further comprises:
a second actuator disposed adjacent to the base to generate a second correction force.

32. A projection lens assembly comprising the stage assembly of claim 19.

33. An object on which an image has been formed by the projection lens assembly of claim 32.

34. A lithography system comprising the projection lens assembly of claim 32.

35. The stage assembly system of claim 19, wherein the at least one actuator comprises a first unit connected to the base and a second unit connected to the stationary surface, the second unit being connected to the first unit magnetically.

36. The stage assembly of claim 35, wherein the at least one actuator generates a driving force by utilizing a magnetic field.

37. The stage assembly of claim 36, wherein the at least one actuator generates a driving force by utilizing a Lorentz force.

38. The stage assembly of claim 37, wherein the at least one actuator comprises one of a voice coil motor, a planar motor, and a linear motor.

39. A stage assembly for manufacturing semiconductor wafers, comprising:
a stage to position at least one substrate, the stage being moved by a force generator in response to a wafer manufacturing control system;
a base supporting the stage, the base being allowed to move in response to a reaction force generated by the force generator;
a plurality of pneumatic bearings to support the base allowing the base to move relative to a stationary surface, the plurality of pneumatic bearings comprising a first layer of pressurized air to allow the base to move linearly along a first axis and a second axis, and to rotate around a third axis, the first, second, and third axes being orthogonal to each other, and a second layer of pressurized air to allow a top flat surface of each of the plurality of pneumatic bearings to conform to an undersurface of the base; and
at least one actuator to control movement of the base, the movement being caused by at least one of a disturbance force and the reaction force.

40. A stage assembly for manufacturing semiconductor wafers, comprising:
a stage to position at least one substrate, the stage being moved in accordance with a wafer manufacturing control system;
a base supporting the stage, the base being allowed to move in response to a reaction force generated by a movement of the stage;
a plurality of pneumatic bearings to allow the base to levitate above a stationary surface, the plurality of pneumatic bearings comprising a first layer of pressurized air to allow the base to move linearly along a first axis and a second axis, and to rotate around a third axis, the first, second, and third axes being orthogonal to each other, and a second layer of pressurized air to allow a top flat surface of each of the plurality of pneumatic bearings to conform to an undersurface of the base; and
at least one actuator to control movement of the base, the movement being caused by at least one of a disturbance force and a reaction force.

41. A stage assembly comprising:
a stage that retains a substrate;
a force generator connected to the stage, the force generator moving the stage;
a movable member that is allowed to move in response to a reaction force generated by at least one of a movement of the stage and the force generator; and
at least one support system that supports the movable member, the at least one support system having a plurality of supporting parts to allow the movable member to move relative to a stationary surface, wherein each of the plurality of supporting parts includes at least two air layers.

42. The stage assembly of claim 41, wherein each of the supporting parts further includes a first bearing part having the first air layer and a second bearing part having the second air layer, wherein the first air layer is planar and the second air layer is spherical.

43. The stage assembly of claim 42, wherein the force generator moves the movable member along a first axis, and the planar air layer allows the movable member to move linearly along the first axis.

44. The stage assembly of claim 42, wherein the at least one support system includes a top flat surface, and the spherical air layer allows the top flat surface to conform to an undersurface of the movable member.

45. The stage assembly of claim 42, wherein the at least one of the first bearing part and the second bearing part comprises one of a pneumatic bearing, magnetic bearing, and mechanical bearing, and a combination thereof.

46. The stage assembly of claim 41, wherein the movable member has an upper side that supports the stage.

47. The stage assembly of claim 46, wherein the at least one support system includes a top flat surface, and the supporting parts include a bearing part having a planar layer that allows the movable member to move linearly and a conforming part that allows the top surface to conform to an undersurface of the movable member.

48. The stage assembly of claim 47, wherein at least one of the supporting parts comprises one of a pneumatic bearing, magnetic bearing, and mechanical bearing, and a combination thereof.

49. An exposure apparatus comprising:
an illumination system that irradiates radiant energy; and
the stage assembly according to the claim 41, the stage assembly disposing an object on a path of the radiant energy.

50. A device manufactured with the exposure apparatus of claim 49.

51. A wafer on which an image has been formed by the exposure apparatus of claim 49.

* * * * *